United States Patent
Shin

(10) Patent No.: US 9,875,809 B2
(45) Date of Patent: Jan. 23, 2018

(54) MEMORY DEVICE AND A MEMORY DEVICE TEST SYSTEM

(71) Applicant: SAMSUNG ELECTRONICS CO., LTD., Suwon-si, Gyeonggi-Do (KR)

(72) Inventor: Won-Hwa Shin, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 3 days.

(21) Appl. No.: 15/224,973

(22) Filed: Aug. 1, 2016

(65) Prior Publication Data

US 2017/0140840 A1    May 18, 2017

(30) Foreign Application Priority Data

Nov. 13, 2015 (KR) .......................... 10-2015-0159246

(51) Int. Cl.
| | |
|---|---|
| *G11C 29/00* | (2006.01) |
| *G11C 29/44* | (2006.01) |
| *G11C 29/52* | (2006.01) |
| *G11C 29/36* | (2006.01) |
| *G11C 29/38* | (2006.01) |

(Continued)

(52) U.S. Cl.
CPC ............ *G11C 29/44* (2013.01); *G11C 7/1006* (2013.01); *G11C 11/4096* (2013.01); *G11C 29/36* (2013.01); *G11C 29/38* (2013.01); *G11C 29/52* (2013.01); *G11C 2207/107* (2013.01)

(58) Field of Classification Search
CPC ......... G11C 29/44; G11C 29/36; G11C 29/38; G11C 29/52; G11C 11/408; G11C 11/4076; G11C 11/4096; G11C 7/1006; G11C 2207/107

USPC ....... 714/719, 718, 733, 734, 701, 702, 762, 714/767, 772, 773, 823; 365/200, 201, 365/202, 189.01, 189.03, 189.04, 190, 365/220
See application file for complete search history.

(56) References Cited

U.S. PATENT DOCUMENTS

| | | | |
|---|---|---|---|
| 4,539,605 A | * | 9/1985 | Hoshino ............ G11B 20/1809 360/32 |
| 5,592,493 A | | 1/1997 | Crouch et al. |
| 5,740,098 A | | 4/1998 | Adams et al. |

(Continued)

FOREIGN PATENT DOCUMENTS

KR           101088588         12/2011

*Primary Examiner* — Christine Tu
(74) *Attorney, Agent, or Firm* — F. Chau & Associates, LLC

(57) ABSTRACT

A memory device includes a controller, a multiplexer, a deserializer, a data modifier, a memory cell array and an error detector. The controller is configured to generate signals in response to an address signal and a command signal. The multiplexer is configured to output a clock signal as internal data signals when the test mode signal is activated. The deserializer is configured to deserialize N bit values included in the internal data signals to generate deserialized signals. The data modifier is configured to invert the deserialized signals to generate bit line signals in response to an inversion control signal and the data modifying signals. The memory cell array is configured to store the bit line signals to memory cells corresponding to the address signal. The error detector is configured to determine if an error exists in signals read from the memory cells and to output an error detecting signal.

20 Claims, 13 Drawing Sheets

(51) Int. Cl.
  *G11C 7/10*  (2006.01)
  *G11C 11/4096*  (2006.01)

(56) References Cited

U.S. PATENT DOCUMENTS

| | | |
|---|---|---|
| 5,774,472 A | 6/1998 | Matsuoka |
| 6,323,664 B1 | 11/2001 | Kim et al. |
| 7,010,736 B1 | 3/2006 | Teh et al. |
| 7,213,185 B2 | 5/2007 | Barone et al. |
| 7,412,672 B1 * | 8/2008 | Wang ............... G01R 31/31926 |
| | | 716/106 |
| 7,765,442 B2 | 7/2010 | Kyung |
| 8,051,342 B2 | 11/2011 | Iioka |
| 8,310,881 B2 | 11/2012 | Moon et al. |
| 2001/0024390 A1 | 9/2001 | Fukuda |
| 2012/0143558 A1 | 6/2012 | Yang |
| 2015/0242352 A1 * | 8/2015 | Jang .................... G06F 13/4243 |
| | | 710/310 |

* cited by examiner

MEMORY DEVICE AND A MEMORY DEVICE TEST SYSTEM

CROSS-REFERENCE TO RELATED APPLICATION

This application claims priority under 35 U.S.C. §119 to Korean Patent Application No. 10-2015-0159246, filed on Nov. 13, 2015 in the Korean Intellectual Property Office (KIPO), the disclosure of which is incorporated by reference herein in its entirety.

TECHNICAL FIELD

Exemplary embodiments of the present inventive concept relate to a memory device, and more particularly, to a memory device for generating an internal data signal using a clock signal without receiving an external data signal when testing the memory device.

DISCUSSION OF THE RELATED ART

A parallel test system has been used to increase productivity of dynamic random access memories ("DRAMs"). Since the number of input and output pins of the parallel test system is limited, the number of input and output pins allocated to each DRAM may decrease when the number of DRAMs to be tested increases.

Among the pins of the parallel test system, the number of pins for transmitting a data signal is relatively large. Accordingly, the number of pins allocated for transmitting the data signal is also decreased when the number of DRAMs to be tested is increased. Accordingly, the operation of the DRAMs is tested using some of the data signals.

However, when the operation of a DRAM is tested using just some of the data signals, certain defects may not be detected.

SUMMARY

According to an exemplary embodiment of the present inventive concept, a memory device includes a controller, a multiplexer (MUX), a deserializer, a data modifier, a memory cell array and an error detector. The controller is configured to generate a test mode signal and data modifying signals in response to an address signal and a command signal. The MUX is configured to output a clock signal as first to M-th internal data signals when the test mode signal is activated. The deserializer is configured to deserialize N bit values included in the first to M-th internal data signals to generate (1, 1) to (M, N) deserialized signals. In addition, M and N are natural numbers. The data modifier is configured to invert the (1, 1) to (M, N) deserialized signals to generate (1, 1) to (M, N) bit line signals in response to an inversion control signal and the data modifying signals. The memory cell array is configured to store the (1, 1) to (M, N) bit line signals to memory cells corresponding to the address signal. The error detector is configured to determine if an error exists in (1, 1) to (M, N) signals read from the memory cells and to output an error detecting signal indicative of the error determination.

According to an exemplary embodiment of the present inventive concept, a memory device test system includes a memory device and a tester configured to generate an address signal, a command signal, an inversion control signal and a clock signal. The tester is further configured to detect an error of the memory device. The memory device includes a controller, a multiplexer (MUX), a deserializer, a data modifier, a memory cell array and an error detector. The controller is configured to generate a test mode signal and data modifying signals in response to the address signal and the command signal. The MUX is configured to output the clock signal as first to M-th internal data signals when the test mode signal is activated. The deserializer is configured to deserialize N bit values included in the first to M-th internal data signals to generate (1, 1) to (M, N) deserialized signals. In addition, M and N are natural numbers. The data modifier is configured to invert the (1, 1) to (M, N) deserialized signals to generate (1, 1) to (M, N) bit line signals in response to the inversion control signal and the data modifying signals. The memory cell array is configured to store the (1, 1) to (M, N) bit line signals to memory cells corresponding to the address signal. The error detector is configured to determine if an error exists in (1, 1) to (M, N) signals read from the memory cells and to output an error detecting signal indicative of the error determination.

According to an exemplary embodiment of the present inventive concept, a memory device includes a multiplexer (MUX), a deserializer, and a data modifier. The MUX is configured to output a clock signal as a plurality of internal signals in response to a test mode signal. The deserializer is configured to generate a plurality of deserialized signals in response to the plurality of internal signals. The data modifier is configured to invert the plurality of deserialized signals to generate a plurality of bit line signals in response to an inversion control signal and data modifying signals.

BRIEF DESCRIPTION OF THE DRAWINGS

The above and other features of the present inventive concept will become more apparent by describing in detail exemplary embodiments thereof, with reference to the accompanying drawings, in which:

FIG. 6 is a timing diagram illustrating an operation of the data modifier of FIG. 4 according to an exemplary embodiment of the present inventive concept;

FIGS. 8 and 9 are timing diagrams illustrating an operation of the data modifier of FIG. 7 according to an exemplary embodiment of the present inventive concept;

DETAILED DESCRIPTION OF THE EMBODIMENTS

Figure 1:
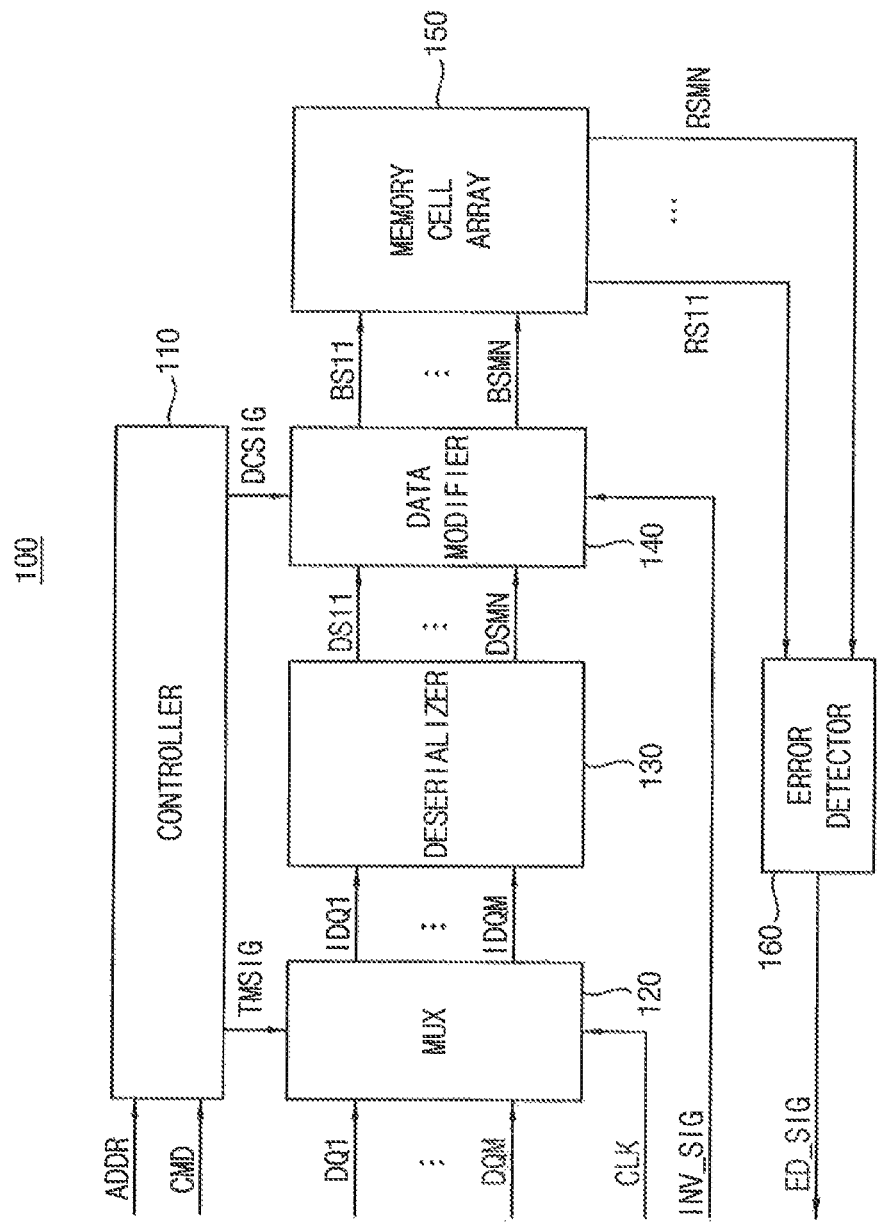
FIG. 1 is a block diagram illustrating a memory device according to an exemplary embodiment of the present inventive concept.

FIG. 1 is a block diagram illustrating a memory device 100 according to an exemplary embodiment of the present inventive concept.

Referring to FIG. 1, the memory device 100 includes a controller 110, a multiplexer (MUX) 120, a deserializer 130, a data modifier 140, a memory cell array 150 and an error detector 160.

The controller 110 generates a test mode signal TMSIG and data modifying signals DCSIG in response to an address signal ADDR and a command signal CMD. In an exemplary embodiment of the present inventive concept, when a first address signal and a first command signal corresponding to activation/deactivation of a test mode are applied as the address signal ADDR and the command signal CMD, the controller 110 may activate/deactivate the test mode signal TMSIG. In an exemplary embodiment of the present inventive concept, when a second address signal and a second command signal (corresponding to a data modifying method) are applied as the address signal ADDR and the command signal CMD, the controller 110 may activate/deactivate of the data modifying signals DCSIG.

When the test mode signal TMSIG is activated, the MUX 120 outputs a clock signal CLK as first to M-th internal data signals IDQ1 to IDQM. When the test mode signal TMSIG is deactivated, the MUX 120 outputs first to M-th data signals DQ1 to DQM as the first to M-th internal data signals IDQ1 to IDQM. When the memory device 100 is tested, the test mode signal TMSIG may be activated. When a processor uses the memory device 100, the test mode signal TMSIG may be deactivated. The MUX is explained in detail referring to FIG. 2.

The deserializer 130 deserializes N bit values included in the first to M-th internal data signals IDQ1 to IDQM to generate (1, 1) to (M, N) deserialized signals. The data modifier 140 inverts the (1, 1) to (M, N) deserialized signals based on an inversion control signal INV_SIG and the data modifying signal DCSIG to generate (1, 1) to (M, N) bit line signals BS11 to BSMN. The deserializer 130 is explained in detail referring to FIG. 3. The data modifier 140 is explained in detail referring to FIGS. 4, 5, 6, 7, 8 and 9.

The memory cell array 150 stores the (1, 1) to (M, N) bit line signals BS11 to BSMN to memory cells corresponding to the address signal ADDR. The memory cell array 150 may output (1, 1) to (M, N) read signals RS11 to RSMN. The error detector 160 determines an error detecting result of the (1, 1) to (M, N) read signals RS11 to RSMN output from the memory cells and outputs an error detecting signal ED_SIG based on the error detecting result. In an exemplary embodiment of the present inventive concept, the error detector 160 may use a cyclic redundancy check method.

The error detector 160 determines an error detecting result of (1, K) to (M, K) read signals RS1K to RSMK from the (1, 1) to (M, N) read signals RS11 to RSMN received from the memory cell array 150. Herein, K is a natural number equal to or less than N. The error detector 160 may output the error detecting result of the (1, K) to (M, K) read signals RS1K to RSMK as the error detecting signal ED_SIG, by increasing K from 1 to N. In an exemplary embodiment of the present inventive concept, M or N may be two. For example, the error detector 160 may output a first error detecting result of (1, 1) and (2, 1) read signals RS11 and RS21 as the error detecting signal ED_SIG. The error detector 160 may output a second error detecting result of (1, 2) and (2, 2) read signals RS12 and RS22 as the error detecting signal ED_SIG. When M and N are not two, the operation of the error detector 160 may be similar to that of the case where M and N are two. For example, M or N may be three. In this example, the error detector 160 may output a first error detecting result of (1, 1) and (3, 1) read signals RS11 and RS21 as the error detecting signal ED_SIG. The error detector 160 may output a second error detecting result of (1, 2) and (3, 2) read signals RS12 and RS32 as the error detecting signal ED_SIG. The error detector 160 may output a third error detecting result of (1, 3) and (3, 3) read signals RS13 and RS33 as the error detecting signal ED_SIG. The operation of the error detector 160 is explained in detail referring to FIG. 10.

Figure 2:
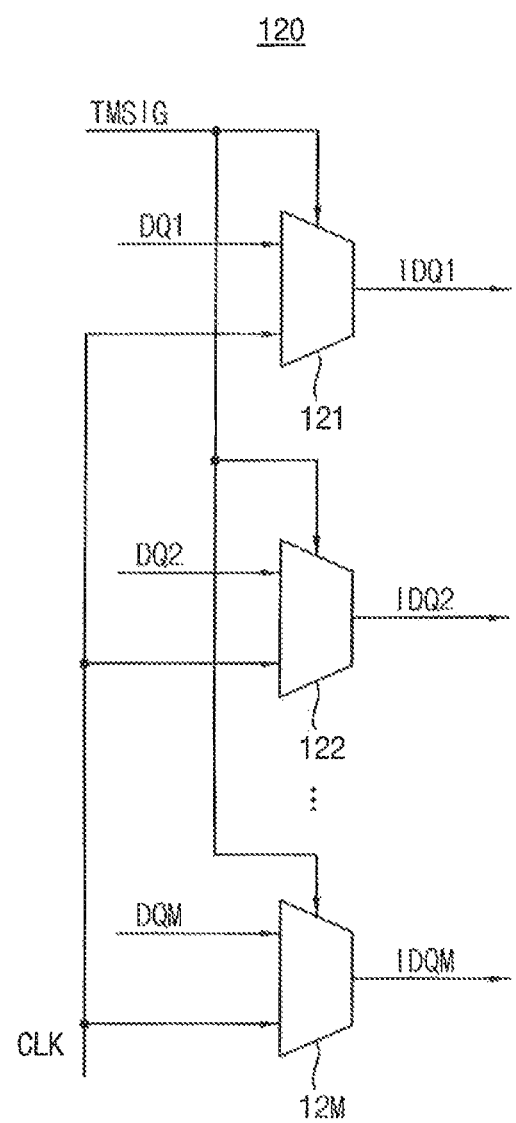
FIG. 2 is a block diagram illustrating a multiplexer (MUX) of the memory device of FIG. 1 according to an exemplary embodiment of the present inventive concept.

FIG. 2 is a block diagram illustrating the MUX 120 of the memory device 100 of FIG. 1 according to an exemplary embodiment of the present inventive concept.

Referring to FIG. 2, the MUX 120 includes first to M-th bit MUXs 121, 122 ... 12M.

When the test mode signal TMSIG is deactivated, a first bit MUX 121 may output a first data signal DQ1 as a first internal data signal IDQ1. When the test mode signal TMSIG is activated, the first bit MUX 121 may output the clock signal CLK as the first internal data signal IDQ1. When the test mode signal TMSIG is deactivated, a second bit MUX 122 may output a second data signal DQ2 as a second internal data signal IDQ2. When the test mode signal TMSIG is activated, the second bit MUX 122 may output the clock signal CLK as the second internal data signal IDQ2. When the test mode signal TMSIG is deactivated, an M-th bit MUX 12M may output an M-th data signal DQM as an M-th internal data signal IDQM. When the test mode signal TMSIG is activated, the M-th bit MUX 12M may output the clock signal CLK as the M-th internal data signal IDQM. In other words, when the test mode data signal TMSIG is deactivated a data signal will be output as an internal data signal IDQ, and when the test mode signal TMSIG is deactivated, the clock signal CLK will be outputted as an internal data signal.

Figure 3:
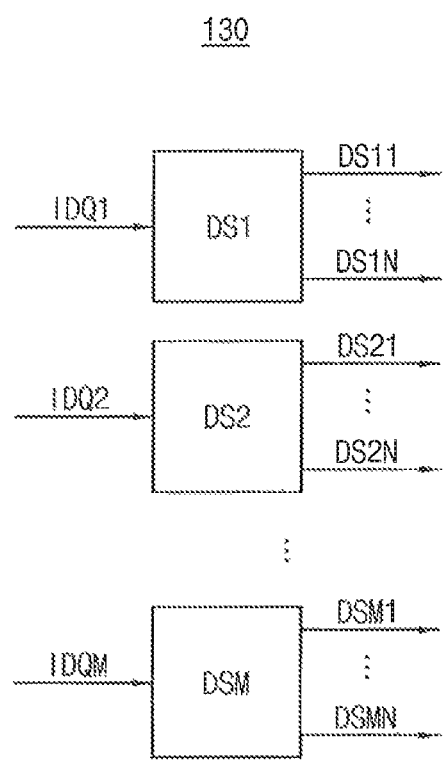
FIG. 3 is a block diagram illustrating a deserializer of the memory device of FIG. 1 according to an exemplary embodiment of the present inventive concept.

FIG. 3 is a block diagram illustrating the deserializer 130 of the memory device of FIG. 1 according to an exemplary embodiment of the present inventive concept.

Referring to FIG. 3, the deserializer 130 may include first to M-th bit deserializers DS1, DS2 to DSM.

A first bit deserializer DS1 may deserialize sequential N bit values included in the first internal data signal IDQ1 to generate (1, 1) to (1, N) deserialized signals (e.g., DS11 to DS1N). A second bit deserializer DS2 may deserialize sequential N bit values included in the second internal data signal IDQ2 to generate (2, 1) to (2, N) deserialized signals (e.g., DS21 to DS2N). An M-th bit deserializer DSM may deserialize sequential N bit values included in the M-th internal data signal IDQM to generate (M, 1) to (M, N) deserialized signals (e.g., DSM1 to DSMN).

In an exemplary embodiment of the present inventive concept, the (1, 1) to (M, N) deserialized signals DS11 to DS1N, DS21 to DS2N and DSM1 to DSMN have uniform values, respectively. A method of respectively maintaining uniform values of the (1, 1) to (M, N) deserialized signals DS11 to DS1N, DS21 to DS2N ... DSM1 to DSMN may be explained in detail referring to FIGS. 6, 8 and 9.

Figure 4:
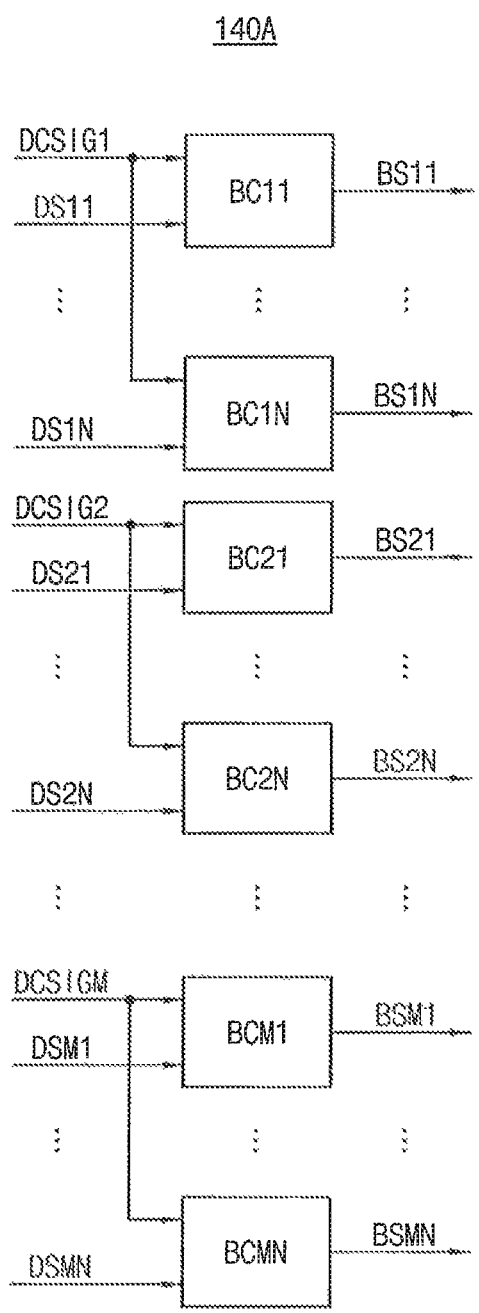
FIG. 4 is a block diagram illustrating a data modifier of the memory device of FIG. 1 according to an exemplary embodiment of the present inventive concept.

FIG. 4 is a block diagram illustrating a data modifier 140A of the memory device 100 of FIG. 1 according to an exemplary embodiment of the present inventive concept.

Referring to FIG. 4, the data modifier 140A may include (1, 1) to (M, N) bit data modifiers BC11 to BC1N, BC21 to BC2N . . . BCM1 to BCMN. The data modifying signals DCSIG may include first to M-th bit data modifying signals DCSIG1, DCSIG2 to DCSIGM.

The (1, 1) bit data modifier BC11 may output the (1, 1) deserialized signal DS11 or an inverted signal of the (1, 1) deserialized signal DS11 as the (1, 1) bit line signal BS11 based on the first bit data modifying signal DCSIG1. The (1, N) bit data modifier BC1N may output the (1, N) deserialized signal DS1N or an inverted signal of the (1, N) deserialized signal DS1N as the (1, N) bit line signal BS1N based on the first bit data modifying signal DCSIG1.

The (2, 1) bit data modifier BC21 may output the (2, 1) deserialized signal DS21 or an inverted signal of the (2, 1) deserialized signal DS21 as the (2, 1) bit line signal BS21 based on the second bit data modifying signal DCSIG2. The (2, N) bit data modifier BC2N may output the (2, N) deserialized signal DS2N or an inverted signal of the (2, N) deserialized signal DS2N as the (2, N) bit line signal BS2N based on the second bit data modifying signal DCSIG2.

The (M, 1) bit data modifier BCM1 may output the (M, 1) deserialized signal DSM1 or an inverted signal of the (M, 1) deserialized signal DSM1 as the (M, 1) bit line signal BSM1 based on the M-th bit data modifying signal DCSIGM. The (M, N) bit data modifier BCMN may output the (M, N) deserialized signal DSMN or an inverted signal of the (M, N) deserialized signal DSMN as the (M, N) bit line signal BSMN based on the M-th bit data modifying signal DCSIGM.

Figure 5:
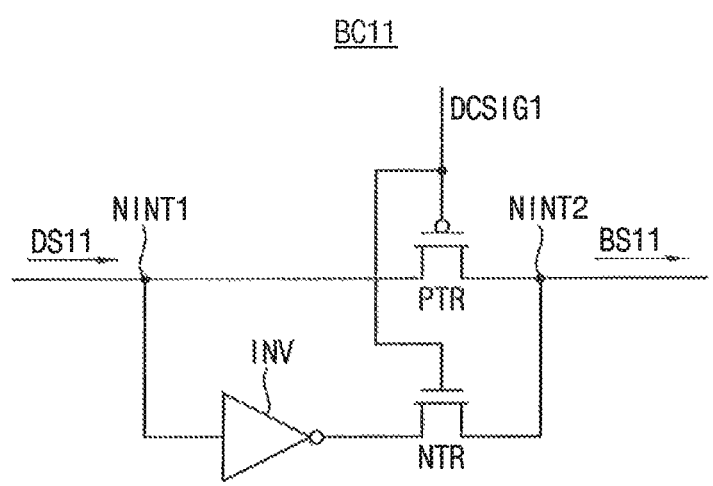
FIG. 5 is a circuit diagram illustrating a (1, 1) bit data modifier of the data modifier of FIG. 4 according to an exemplary embodiment of the present inventive concept.

FIG. 5 is a circuit diagram illustrating the (1, 1) bit data modifier BC11 of the data modifier 140A of FIG. 4 according to an exemplary embodiment of the present inventive concept. Other bit data modifiers BC1N, BC21, BC2N, BCM1 and BCMN may have a structure substantially the same as the (1, 1) bit data modifier BC11.

Referring to FIG. 5, the (1, 1) bit data modifier BC11 may include a P-type metal oxide semiconductor (PMOS) transistor PTR, an N-type metal oxide semiconductor (NMOS) transistor NTR and an inverter INV.

The (1, 1) deserialized signal DS11 may be applied to a first internal node NINT1 of the (1, 1) bit data modifier BC11. A source electrode of the PMOS transistor PTR may be connected to the first internal node NINT1. The first bit data modifying signal DCSIG1 may be applied to a gate electrode of the PMOS transistor PTR. A drain electrode of the PMOS transistor PTR may be connected to a second internal node NINT2 of the (1, 1) bit data modifier BC11. An input terminal of the inverter INV may be connected to the first internal node NINT1. An output terminal of the inverter INV may be connected to a source electrode of the NMOS transistor NTR. The first bit data modifying signal DCSIG1 may be applied to a gate electrode of the NMOS transistor NTR. A drain electrode of the NMOS transistor NTR is connected to the second internal node NINT2. The (1, 1) bit line signal BS11 may be outputted from the second internal node NINT2. In other words, the (1, 1) bit data modifier BC11 may output the (1, 1) deserialized signal DS11 as the (1, 1) bit line signal BS11 based on the first bit data modifying signal DCSIG1.

When the first bit data modifying signal DCSIG1 is deactivated (e.g., DCSIG1=0), the (1, 1) bit data modifier BC11 may output the (1, 1) deserialized signal DS11 as the (1, 1) bit line signal BS11. When the first bit data modifying signal DCSIG1 is activated (e.g., DCSIG1=1), the (1, 1) bit data modifier BC11 may output the inverted signal of the (1, 1) deserialized signal DS11 as the (1, 1) bit line signal BS11.

Figure 6:
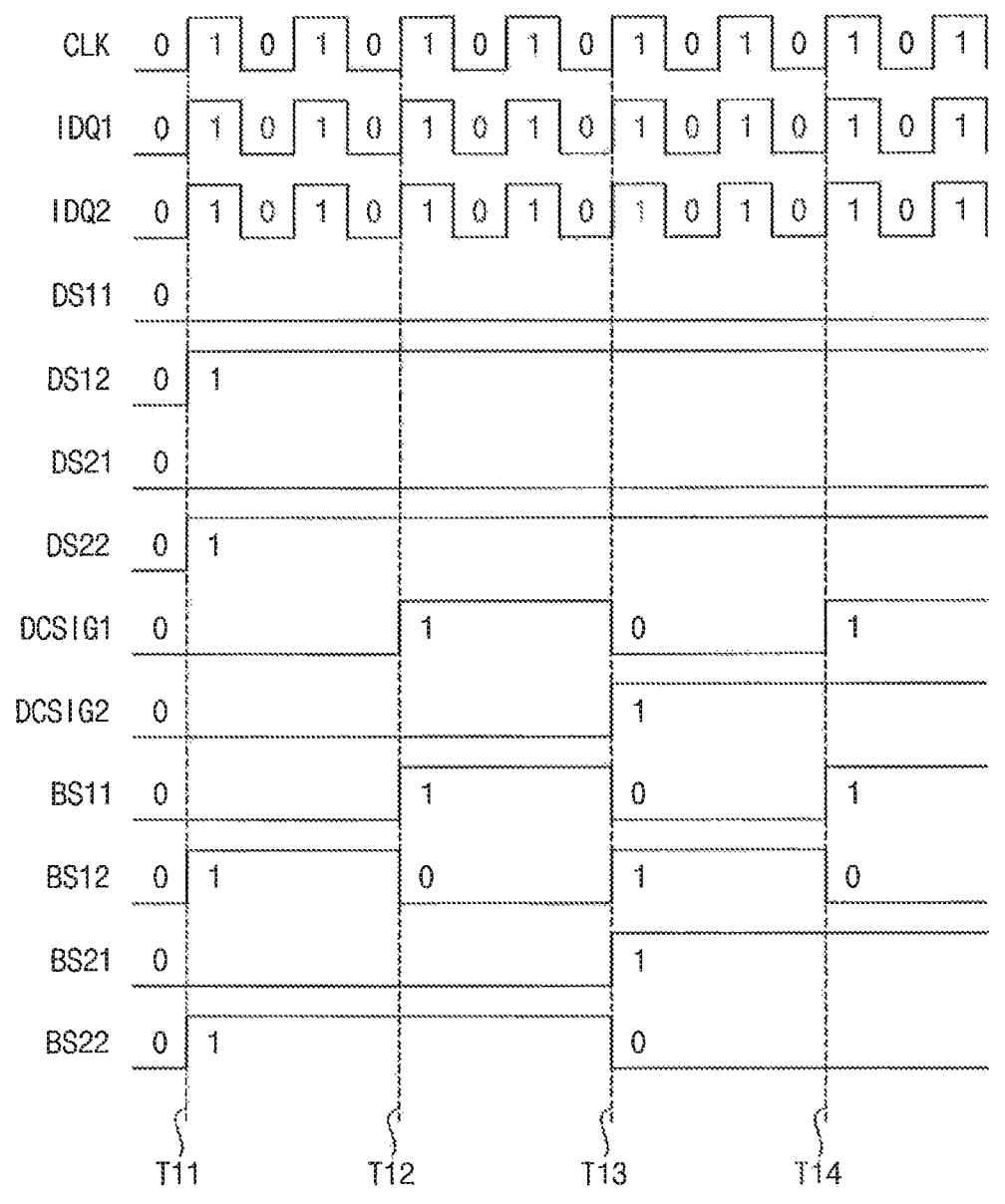

FIG. 6 is a timing diagram illustrating an operation of the data modifier 140A of FIG. 4 according to an exemplary embodiment of the present inventive concept.

In FIG. 6, M is two and N is two. When the test mode signal TMSIG is activated, the MUX 120 outputs the clock signal CLK as the first internal data signal IDQ1 and the second internal data signal IDQ2.

The first bit deserializers DS1 may deserialize two sequential bit values in the first internal data signal IDQ1 to generate (1, 1) and (1, 2) deserialized signals DS11 and DS12. For example, the (1, 1) deserialized signal DS11 maintains zero and the (1, 2) deserialized signal DS12 maintains one. The second bit deserializers DS2 may deserialize two sequential bit values in the second internal data signal IDQ2 to generate (2, 1) and (2, 2) deserialized signals DS21 and DS22. For example, the (2, 1) deserialized signal DS21 maintains zero and the (2, 2) deserialized signal DS22 maintains one. Further, the deserialized signals DS11, DS12, DS21 and DS22 all maintained uniform values of either, for example, zero or one.

At a first time T11, the data modifying signals DCSIG1 and DCSIG2 of 00 are applied to the data modifier 140A, and the data modifier 140A may modify the (1, 1) to (2, 2) bit line signals BS11, BS12, BS21 and BS22 to 0101. At a second time T12, the data modifying signals DCSIG1 and DCSIG2 of 00 are changed to 10 and are applied to the data modifier 140A, and the data modifier 140A may modify the (1, 1) to (2, 2) bit line signals BS11, BS12, BS21 and BS22 to 1001. At a third time T13, the data modifying signals DCSIG1 and DCSIG2 of 10 are changed to 01 and are applied to the data modifier 140A, and the data modifier 140A may modify the (1, 1) to (2, 2) bit line signals BS11, BS12, BS21 and BS22 to 0110. In a fourth time T14, the data modifying signals DCSIG1 and DCSIG2 of 01 are changed to 11 and are applied to the data modifier 140A, and the data modifier 140A may modify the (1, 1) to (2, 2) bit line signals BS11, BS12, BS21 and BS22 to 1010.

As explained above, when the test mode signal TMSIG is activated, the memory device 100 may not receive the first to M-th data signals DQ1 to DQM. Instead, when the test mode signal TMSIG is activated, the memory device 100 may modify the (1, 1) to (2, 2) bit line signals BS11, BS12, BS21 and BS22 using the data modifying signals DCSIG1 and DCSIG2 that were set based on the address signal ADDR, the command signal CMD and the clock signal CLK. In addition, the memory device 100 may output the (1, 1) to (2, 2) bit line signals BS11, BS12, BS21 and BS22 to the memory cell array 150.

Figure 7:
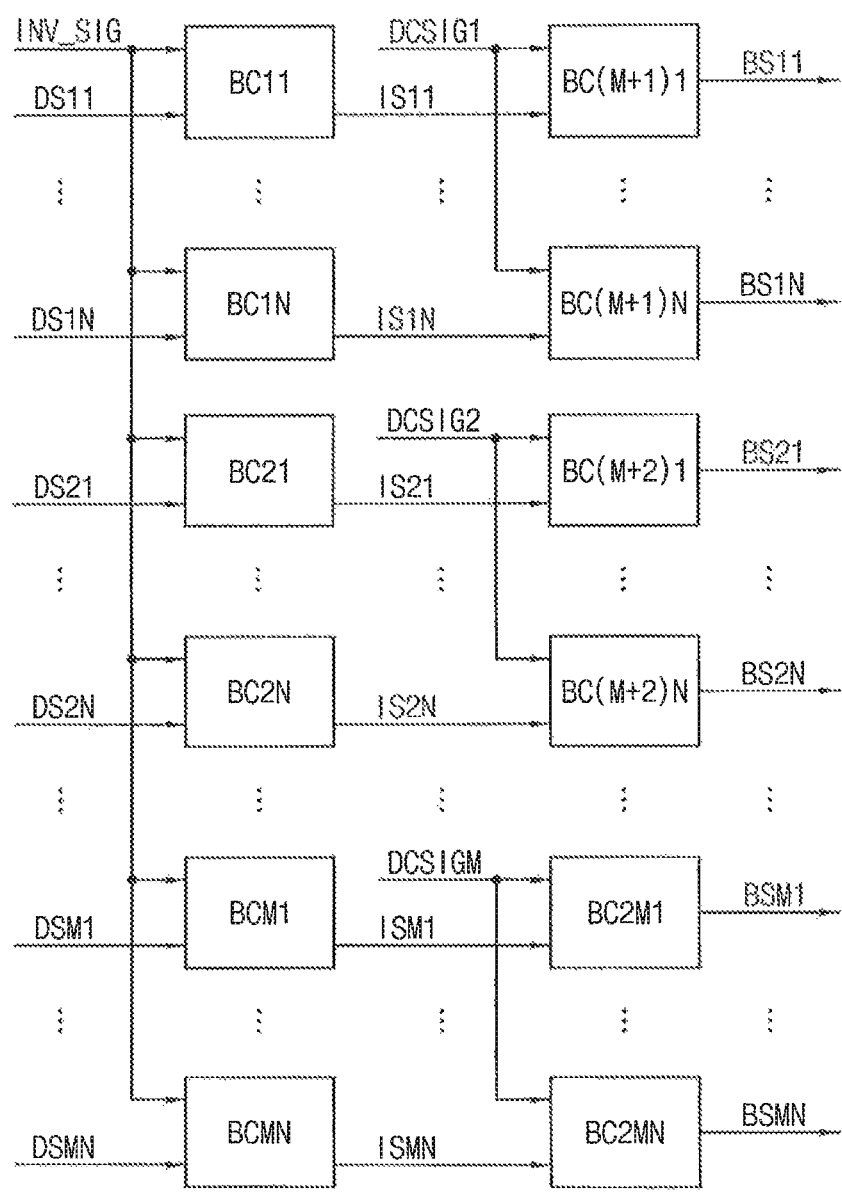
FIG. 7 is a block diagram illustrating a data modifier of the memory device of FIG. 1 according to an exemplary embodiment of the present inventive concept.

FIG. 7 is a block diagram illustrating a data modifier 140B of the memory device of FIG. 1 according to an exemplary embodiment of the present inventive concept. The data modifier according to the exemplary embodiment of the present inventive concept may have a structure which is different from the data modifier 140A in FIG. 4.

Referring to FIG. 7, the data modifier 140B may include (1, 1) to (2M, N) bit data modifiers BC11 to BC1N, BC21 to BC2N, BCM1 to BCMN, BC(M+1)1 to BC(M+1)N, BC(M+2)1 to BC(M+2)N . . . BC2M1 to BC2MN. The (1, 1) to (2M, N) bit data modifiers BC11 to BC1N, BC21 to BC2N, BCM1 to BCMN, BC(M+1)1 to BC(M+1)N, BC(M+2)1 to BC(M+2)N . . . BC2M1 to BC2MN may have a structure substantially the same as the first bit data modifier BC11 in FIG. 5. The data modifying signal DCSIG may include the first to M-th data bit data modifying signals DCSIG1, DCSIG2 to DCSIGM.

The (1, 1) bit data modifier BC11 may output the (1, 1) deserialized signal DS11 or an inverted signal of the (1, 1) deserialized signal DS11 as a (1, 1) internal signal IS11 based on the inversion control signal INV_SIG. The (M+1, 1) bit data modifier BC(M+1)1 may output the (1, 1) internal signal IS11 or an inverted signal of the (1, 1) internal signal IS11 as the (1, 1) bit line signal BS11 based on the first bit data modifying signal DCSIG1. The (1, N) bit data modifier BC1N may output the (1, N) deserialized signal DS1N or an inverted signal of the (1, N) deserialized signal DS1N as a (1, N) internal signal IS1N based on the inversion control signal INV_SIG. The (M+1, N) bit data modifier BC(M+1)N may output the (1, N) internal signal IS1N or an inverted signal of the (1, N) internal signal IS1N as the (1, N) bit line signal BS1N based on the first bit data modifying signal DCSIG1.

The (2, 1) bit data modifier BC21 may output the (2, 1) deserialized signal DS21 or an inverted signal of the (2, 1) deserialized signal DS21 as a (2, 1) internal signal IS21 based on the inversion control signal INV_SIG. The (M+2, 1) bit data modifier BC(M+2)1 may output the (2, 1) internal signal IS21 or an inverted signal of the (2, 1) internal signal IS21 as the (2, 1) bit line signal BS21 based on the second bit data modifying signal DCSIG2. The (2, N) bit data modifier BC2N may output the (2, N) deserialized signal DS2N or an inverted signal of the (2, N) deserialized signal DS2N as a (2, N) internal signal IS2N based on the inversion control signal INV_SIG. The (M+2, N) bit data modifier BC(M+2)N may output the (2, N) internal signal IS2N or an inverted signal of the (2, N) internal signal IS2N as the (2, N) bit line signal BS2N based on the second bit data modifying signal DCSIG2.

The (M, 1) bit data modifier BCM1 may output the (M, 1) deserialized signal DSM1 or an inverted signal of the (M, 1) deserialized signal DSM1 as a (M, 1) internal signal ISM1 based on the inversion control signal INV_SIG. The (2M, 1) bit data modifier BC2M1 may output the (M, 1) internal signal ISM1 or an inverted signal of the (M, 1) internal signal ISM1 as the (M, 1) bit line signal BSM1 based on the M-th bit data modifying signal DCSIGM. The (M, N) bit data modifier BCMN may output the (M, N) deserialized signal DSMN or an inverted signal of the (M, N) deserialized signal DSMN as a (M, N) internal signal ISMN based on the inversion control signal INV_SIG. The (2M, N) bit data modifier BC2MN may output the (M, N) internal signal ISMN or an inverted signal of the (M, N) internal signal ISMN as the (M, N) bit line signal BSMN based on the M-th bit data modifying signal DCSIGM.

Figure 8:
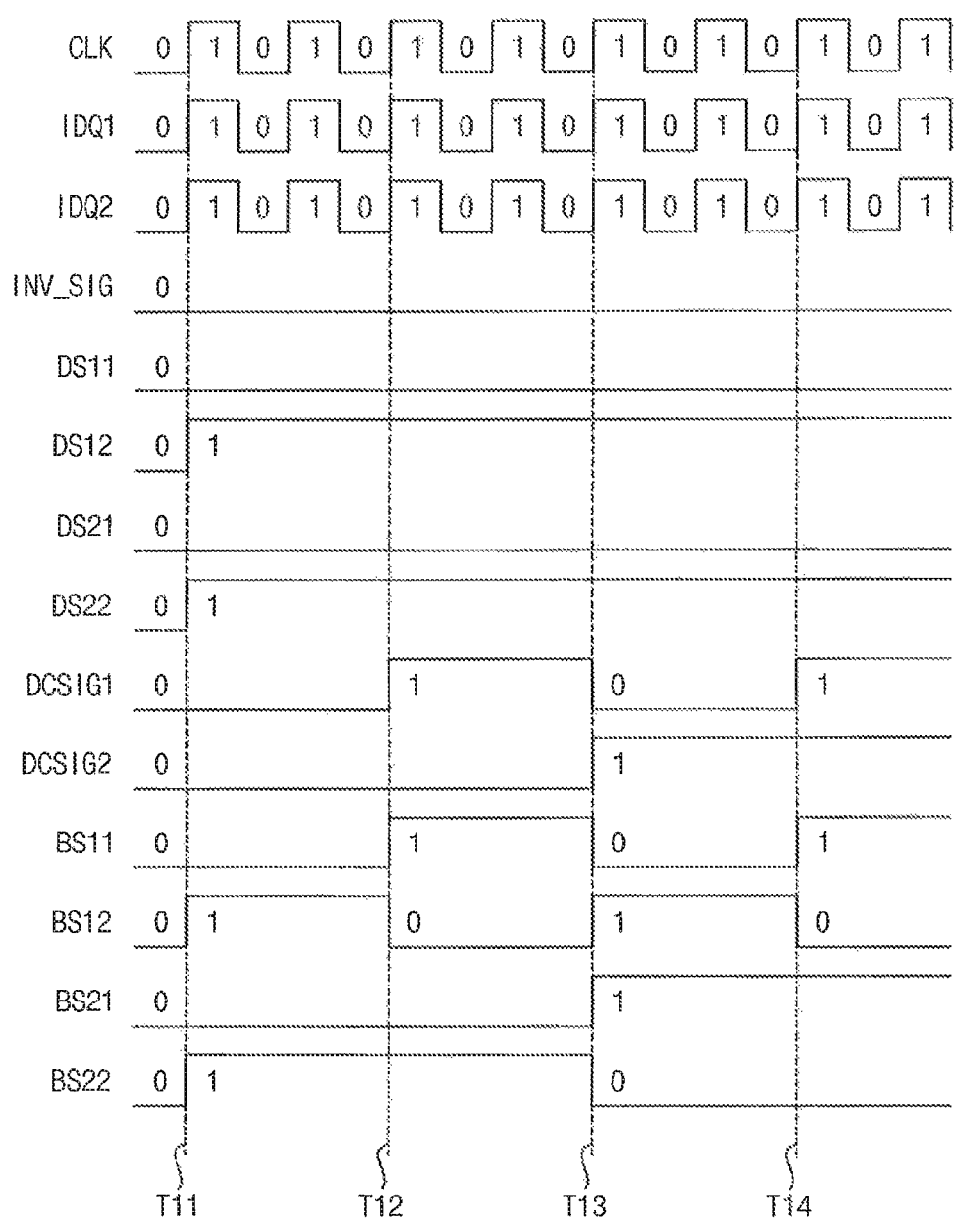
Figure 9:
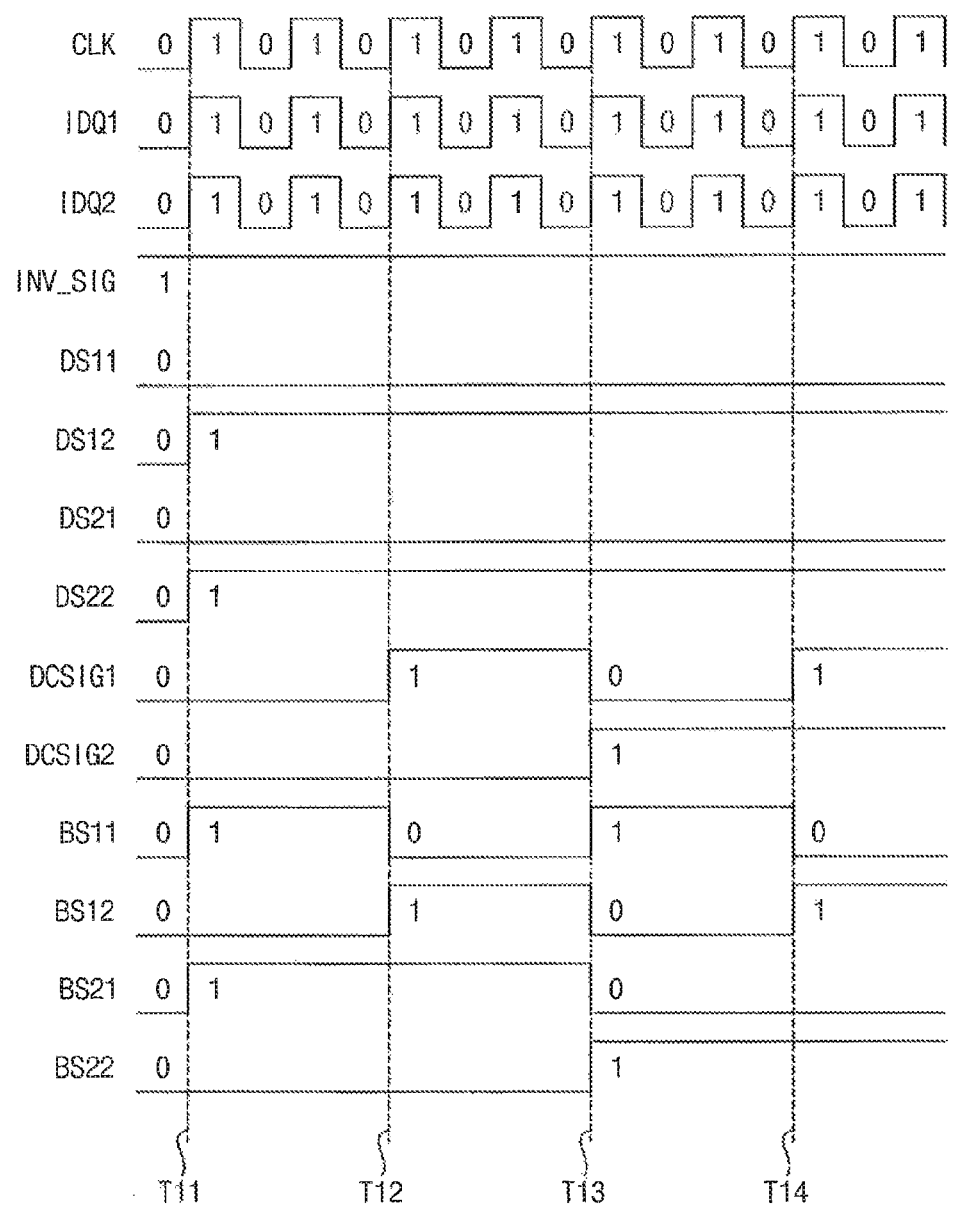

FIGS. 8 and 9 are timing diagrams illustrating an operation of the data modifier 140B of FIG. 7 according to an exemplary embodiment of the present inventive concept.

In FIG. 8, the inversion control signal INV_SIG is deactivated (e.g., INV_SIG=0). (1, 1) to (2, 2) bit line signals BS11, BS12, BS21 and BS22 in FIG. 8 are sequentially modified in a sequence of 0000, 0101, 1001, 0110, 1010 according to the data modifying signals DCSIG1 and DCSIG2. This sequence is similar to the (1, 1) to (2, 2) bit line signals BS11, BS12, BS21 and BS22 in FIG. 6. Further, the deserialized signals DS11, DS12, DS21 and DS22 all maintained uniform values of either, for example, zero or one, similar to FIG. 6.

In FIG. 9, the inversion control signal INV_SIG is activated (e.g., INV_SIG=1). (1, 1) to (2, 2) bit line signals BS11, BS12, BS21 and BS22 in FIG. 9 are sequentially modified in a sequence of 0000, 1010, 0110, 1001, 0101 according to the data modifying signals DCSIG1 and DCSIG2. Further, the deserialized signals DS11, DS12, DS21 and DS22 all maintained uniform values of either, for example, zero or one similar to FIGS. 6 and 8.

Figure 10:
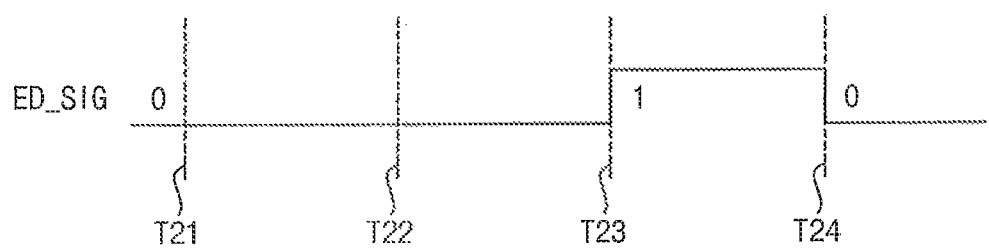
FIG. 10 is a timing diagram illustrating an error detecting signal of the memory device of FIG. 1 according to an exemplary embodiments of the present inventive concept.

FIG. 10 is a timing diagram illustrating an error detecting signal ED_SIG of the memory device 100 of FIG. 1 according to exemplary embodiments of the present inventive concept.

In FIG. 10, N is four. The error detector 160 may determine an error detecting result of (1, K) to (M, K) read signals RS1K to RSMK. The error detector 160 may output the error detecting result of the (1, K) to (M, K) read signals RS1K to RSMK as the error detecting signal ED_SIG, by increasing K from 1 to N. Herein, K is a natural number equal to or less than four. For example, if the error detector 160 does not detect an error in the (1, 1) to (M, 1) read signals RS11 to RSM1, the error detector 160 may output a first error detecting result of zero, as the error detecting signal ED_SIG at a first time T21. For example, the error detector 160 does not detect the error of the (1, 2) to (M, 2) read signals RS12 to RSM2, and the error detector 160 outputs a second error detecting result of zero, as the error detecting signal ED_SIG at a second time T22. For example, if the error detector 160 detects an error in the (1, 3) to (M, 3) read signals RS13 to RSM3, the error detector 160 may output a third error detecting result of one, as the error detecting signal ED_SIG at a third time T23. For example, if the error detector 160 does not detect an error in the (1, 4) to (M, 4) read signals RS14 to RSM4, the error detector 160 may output a fourth error detecting result of zero as the error detecting signal ED_SIG at a fourth time T24. In the timeline of FIG. 10, the error detecting signal ED_SIG was activated to one (e.g., at the third time T23); therefore the memory device 100 may be determined to have the error.

When N is not four, the method of detecting the error may be similar to that of the case where N is four. For example, N may be five. In this example, if the error detector 160 detects an error in the (1, 5) to (M, 5) read signals RS15 to RSM5, the error detector 160 may output a fifth error detecting result of one, as the error detecting signal ED_SIG at a fifth time.

Figure 11:
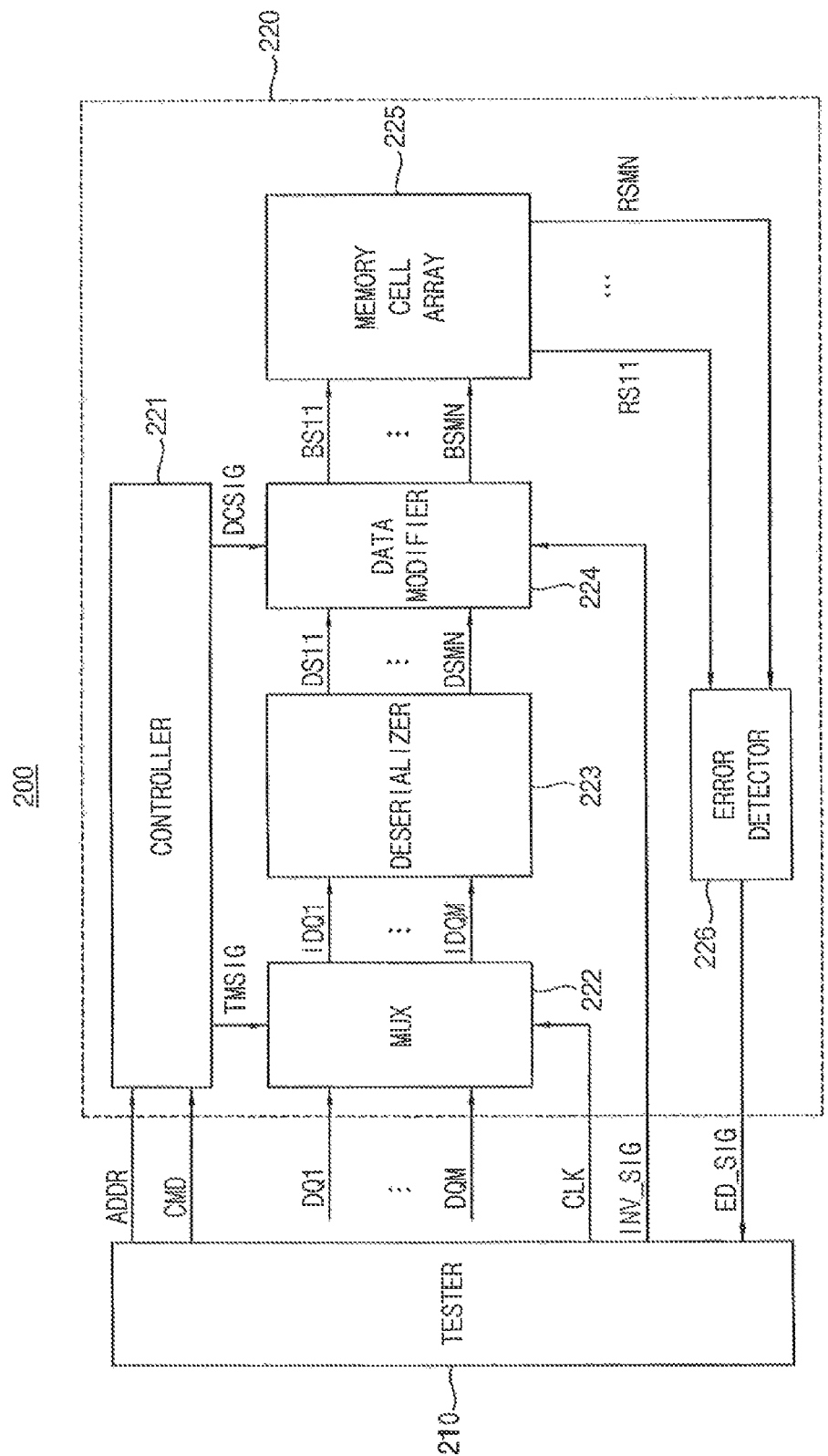
FIG. 11 is a block diagram illustrating a memory device test system according to an exemplary embodiment of the present inventive concept.

FIG. 11 is a block diagram illustrating a memory device test system according to an exemplary embodiment of the present inventive concept.

Referring to FIG. 11, the memory device test system 200 includes a tester 210 and a memory device 220.

The tester 210 generates an address signal ADDR, a command signal CMD, an inversion control signal INV_SIG and a clock signal CLK. The tester 210 detects the error of the memory device 220 based on an error detecting signal ED_SIG.

The memory device 220 includes a controller 221, a MUX 222, a deserializer 223, a data modifier 224, a memory cell array 225 and an error detector 226.

The controller 221 generates a test mode signal TMSIG and data modifying signals DCSIG in response to an address signal ADDR and a command signal CMD received from the tester 210. When the test mode signal TMSIG is activated (e.g., TMSIG=1), the MUX 222 outputs a clock signal CLK as first to M-th internal data signals IDQ1 to IDQM. The deserializer 223 deserializes N bit values included in the first to M-th internal data signals IDQ1 to IDQM to generate (1, 1) to (M, N) deserialized signals DS11 to DSMN. The data modifier 224 inverts the (1, 1) to (M, N) deserialized signals based on an inversion control signal INV_SIG received from the tester 210, and the data modifying signal DCSIG to generate (1, 1) to (M, N) bit line signals BS11 to BSMN. The memory cell array 225 stores the (1, 1) to (M, N) bit line signals BS11 to BSMN to memory cells corresponding to the address signal ADDR. The memory cell array 225 may output (1, 1) to (M, N) read signals RS11 to RSMN. The error detector 226 determines an error detecting result of the (1, 1) to (M, N) read signals RS11 to RSMN output from the memory cells and outputs an error detecting signal ED_SIG based on the error detecting result.

In an exemplary embodiment of the present inventive concept, when the memory device 220 does not have an error, the tester 210 may adjust the address signal ADDR, the command signal CMD and the inversion control signal INV_SIG so that the error detecting result of the (1, 1) to (M, N) read signals RS11 to RSMN may be zero.

The error detector 226 determines an error detecting result of (1, K) to (M, K) read signals RS1K to RSMK from the (1, 1) to (M, N) read signals RS11 to RSMN received from the memory cell array 225. Herein, K is a natural number equal to or less than N. The error detector 160 may output the error detecting result of the (1, K) to (M, K) read signals RS1K to RSMK as the error detecting signal ED_SIG, by increasing K from 1 to N. When the (1, K) to (M, K) read signals RS1K to RSMK have an error, the error detector 226 may output one as the K-th error detecting result. When the (1, K) to (M, K) read signals RS1K to RSMK do not have an error, the error detector 226 may output zero as the K-th error detecting result. When the error detecting signal ED_SIG is activated (e.g., ED_SIG=1), the tester 210 may determine that the memory device 220 has an error. When the error detecting signal ED_SIG is deactivated (e.g., ED_SIG=0), the tester 210 may determine that the memory device 220 does not have an error. As an example of using the level of the error detecting signal ED_SIG to identify errors, refer to FIG. 10.

Figure 12:
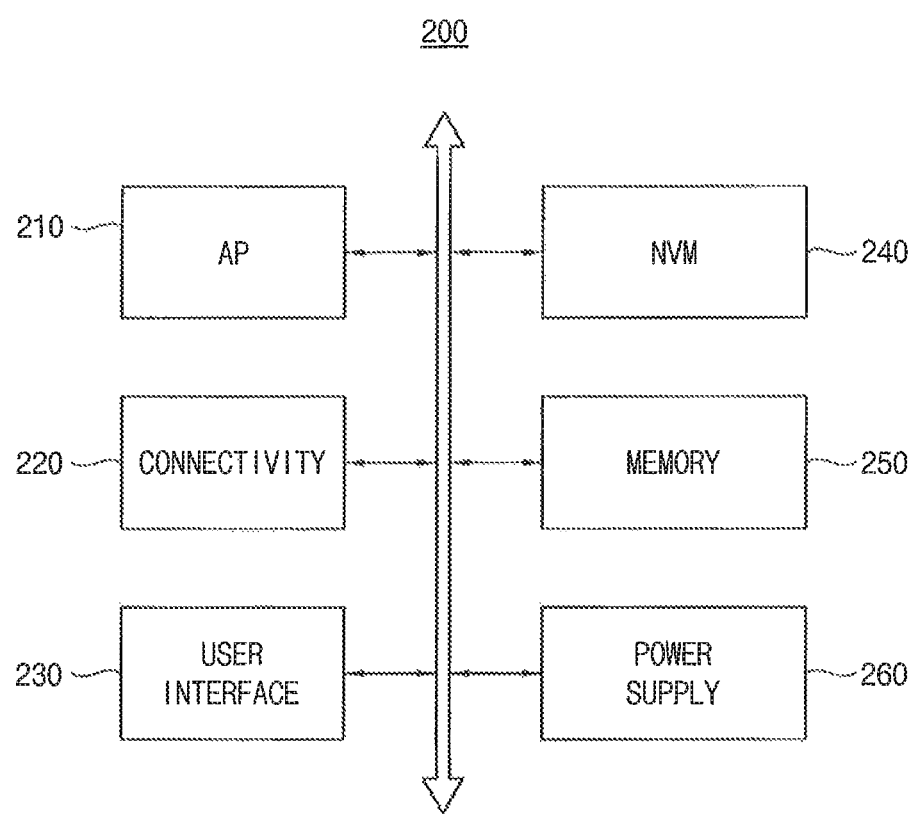
FIG. 12 is a diagram illustrating a memory device according to an exemplary embodiment of the present inventive concept applied to a mobile system.

FIG. 12 is a diagram illustrating a memory device according to an exemplary embodiment of the present inventive concept applied to a mobile system 200.

Referring to FIG. 12, a mobile system 200 includes an application processor 210, a connectivity unit 220, a user interface 230, a nonvolatile memory device 240, a memory device 250, and a power supply 260. In an exemplary embodiment of the present inventive concept, the mobile system 200 may be a mobile phone, a smart phone, a personal digital assistant (PDA), a portable multimedia player (PMP), a digital camera, a music player, a portable game console, a navigation system, etc.

The application processor 210 may execute applications, such as a web browser, a game application, a video player, etc. In an exemplary embodiment of the present inventive concept, the application processor 210 may include a single core or multiple cores. For example, the application processor 210 may be a multi-core processor, such as a dual-core processor, a quad-core processor, a hexa-core processor, etc. The application processor 210 may include an internal or external cache memory.

The connectivity unit 220 may perform wired or wireless communication with an external device. For example, the connectivity unit 220 may perform Ethernet communication, near field communication (NFC), radio frequency identification (RFID) communication, mobile telecommunication, memory card communication, universal serial bus (USB) communication, etc. In an exemplary embodiment of the present inventive concept, the connectivity unit 220 may include a baseband chipset that supports communications, such as global system for mobile communications (GSM), general packet radio service (GPRS), wideband code division multiple access (WCDMA), high speed downlink/uplink packet access (HSxPA), etc.

The memory device 250 may store data processed by the application processor 210, or may operate as a working memory. The memory device 100 in FIG. 1 may be employed to the memory device 250. The structure and the operation of the memory device 100 in FIG. 1 are explained referring to FIGS. 1 to 10 in detail so that any repetitive explanation concerning the memory device 250 will be omitted.

The nonvolatile memory device 240 may store a boot image for booting the mobile system 200. For example, the nonvolatile memory device 240 may be an electrically erasable programmable read-only memory (EEPROM), a flash memory, a phase change random access memory (PRAM), a resistance random access memory (RRAM), a nano-floating gate memory (NFGM), a polymer random access memory (PoRAM), a magnetic random access memory (MRAM), a ferroelectric random access memory (FRAM), etc.

The user interface 230 may include at least one input device, such as a keypad, a touch screen, etc., and at least one output device, such as a speaker, a display device, etc. The power supply 260 may supply a power supply voltage to the mobile system 200.

In an exemplary embodiment of the present inventive concept, the mobile system 200 may further include a camera image processor (CIS), and/or a storage device, such as a memory card, a solid state drive (SSD), a hard disk drive (HDD), a compact disk read only memory (CD-ROM), etc.

In an exemplary embodiment of the present inventive concept, the mobile system 200 and/or components of the mobile system 200 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi-chip package (MCP), wafer-level fabricated package (WFP), or wafer-level processed stack package (WSP).

Figure 13:
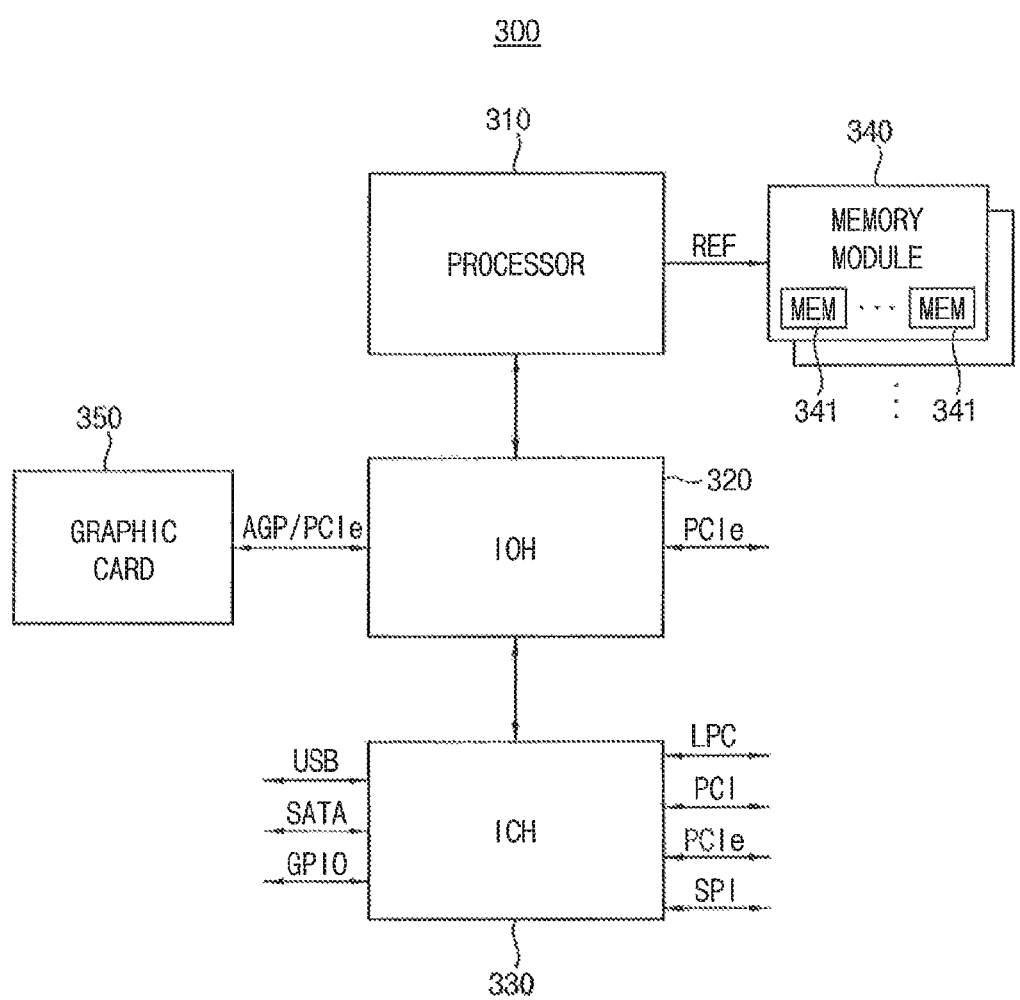
FIG. 13 is a diagram illustrating a memory device according to an exemplary embodiment of the present inventive concept applied to a computing system.

FIG. 13 is a diagram illustrating a memory device according to an exemplary embodiment of the present inventive concept applied to a computing system 300.

Referring to FIG. 13, a computing system 300 includes a processor 310, an input/output hub (IOH) 320, an input/output controller hub (ICH) 330, at least one memory module 340 and a graphics card 350. In an exemplary embodiment of the present inventive concept, the computing system 300 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 310 may perform various computing functions, such as executing specific software for performing specific calculations or tasks. For example, the processor 310 may be a microprocessor, a central process unit (CPU), a digital signal processor, or the like. In an exemplary embodiment of the present inventive concept, the processor 310 may include a single core or multiple cores. For example, the processor 310 may be a multi-core processor, such as a dual-core processor, a quad-core processor, a hexa-core processor, etc. Although FIG. 13 illustrates the computing system 300 including one processor 310. In an exemplary embodiment of the present inventive concept, the computing system 300 may include a plurality of processors. The processor 310 may include an internal or external cache memory.

The processor 310 may include a memory controller for controlling operations of the memory module 340. The memory controller included in the processor 310 may be referred to as an integrated memory controller (IMC). A memory interface between the memory controller and the memory module 340 may be implemented with a single channel including a plurality of signal lines, or may be implemented with multiple channels respectively coupled to at least one memory module 340. In an exemplary embodiment of the present inventive concept, the memory controller may be located inside the input/output hub 320, which may be referred to as a memory controller hub (MCH).

The memory module 340 may include a plurality of memory devices (MEM) 341 that store data provided from the memory controller. In an exemplary embodiment of the present inventive concept, the memory device 100 in FIG. 1 may be employed by the memory device 341. The structure and the operation of the memory device 100 in FIG. 1 are explained referring to FIGS. 1 to 10, and thus, any repetitive explanation concerning the memory device 341 will be omitted.

The input/output hub 320 may manage data transfer between processor 310 and devices, such as the graphics card 350. The input/output hub 320 may be coupled to the processor 310 via various interfaces. For example, the interface between the processor 310 and the input/output hub 320 may be a front side bus (FSB), a system bus, a HyperTransport, a lightning data transport (LDT), a Quick-Path interconnect (QPI), a common system interface (CSI), etc. Although FIG. 13 illustrates the computing system 300 including one input/output hub 320, in an exemplary embodiment of the present inventive concept, the computing system 300 may include a plurality of input/output hubs. The input/output hub 320 may provide various interfaces with the devices. For example, the input/output hub 320 may provide an accelerated graphics port (AGP) interface, a peripheral component interface-express (PCIe), a communications streaming architecture (CSA) interface, etc.

The graphics card 350 may be coupled to the input/output hub 320 via AGP or PCIe. The graphics card 350 may control a display device for displaying an image. The graphics card 350 may include an internal processor for processing image data and an internal semiconductor memory device. In an exemplary embodiment of the present inventive concept, the input/output hub 320 may include an internal graphics device along with or instead of the graphics card 350. The internal graphics device may be separated from the graphics card 330. The graphics device included in the input/output hub 320 may be referred to as an integrated graphics card. Further, the input/output hub 320 including the internal memory controller and the internal graphics device may be referred to as a graphics and memory controller hub (GMCH).

The input/output controller hub 330 may perform data buffering and interface arbitration to efficiently operate various system interfaces. The input/output controller hub 330 may be coupled to the input/output hub 320 via an internal bus, such as a direct media interface (DMI), a hub interface, an enterprise Southbridge interface (ESI), PCIe, etc.

The input/output controller hub 330 may provide various interfaces with peripheral devices. For example, the input/output controller hub 330 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In an exemplary embodiment of the present inventive concept, the processor 310, the input/output hub 320 and the input/output controller hub 330 may be implemented as separate chipsets or separate integrated circuits. In an exemplary embodiment of the present inventive concept, at least two of the processor 310, the input/output hub 320 and the input/output controller hub 330 may be implemented as a single chipset.

The exemplary embodiments of the present inventive concept may be applied to an electronic device including a memory device. For example, an exemplary embodiment of the present inventive concept may be applied to a mobile phone, a smart phone, a PDA, a PMP, a digital camera, a camcorder, a PC, a server computer, a workstation, a laptop, a digital television, a set-top box, a music player, a portable game console, a navigation system, a smart card, a printer, etc.

The exemplary embodiments of the present inventive concept provide a memory device generating an internal data signal using a clock signal without receiving an external data signal when testing the memory device and being tested using the internal data signal.

Exemplary embodiments of the present inventive concept also provide a memory device test system. In the memory device test system, a tester does not provide a data signal to the memory device, the memory device generates an internal data signal using a clock signal when testing the memory device and the memory device is tested using the internal data signal.

While exemplary embodiments of the present inventive concept have been shown and described above, it will be apparent to those skilled in the art that modifications and variations could be made without departing from the scope of the present inventive concept as defined by the appended claims.

What is claimed is:

1. A memory device, comprising:
    a controller configured to generate a test mode signal and data modifying signals in response to an address signal and a command signal;
    a multiplexer (MUX) configured to output a clock signal as first to M-th internal data signals when the test mode signal is activated;
    a deserializer configured to deserialize N bit values included in the first to M-th internal data signals to generate (1, 1) to (M, N) deserialized signals, wherein M and N are natural numbers;
    a data modifier configured to invert the (1, 1) to (M, N) deserialized signals to generate (1, 1) to (M, N) bit line signals in response to an inversion control signal and the data modifying signals;
    a memory cell array configured to store the (1, 1) to (M, N) bit line signals to memory cells corresponding to the address signal; and
    an error detector configured to determine if an error exists in (1, 1) to (M, N) signals read from the memory cells and to output an error detecting signal indicative of the error determination.

2. The memory device of claim 1, wherein when the test mode signal is deactivated, the MUX outputs first to M-th data signals as the first to M-th internal data signals.

3. The memory device of claim 1, wherein the MUX comprises:
    first to M-th bit MUXs,
    when the test mode signal is deactivated, a K bit MUX outputs a K-th data signal as a K-th internal data signal, wherein K is a natural number equal to or less than M, and
    when the test mode signal is activated, the K bit MUX outputs the clock signal as the K-th internal data signal.

4. The memory device of claim 1, wherein the deserializer comprises:
first to M-th bit deserializers; and
a K-th bit deserializer configured to deserialize sequential N bit values included in a K-th internal data signal to generate (K, 1) to (K, N) deserialized signals, wherein K is a natural number equal to or less than M.

5. The memory device of claim 1, wherein the (1, 1) to (M, N) deserialized signals respectively maintain uniform values.

6. The memory device of claim 1, wherein the N bit values are sequential N bit values included in the first to M-th internal data signals.

7. The memory device of claim 1, wherein the data modifier comprises:
(1, 1) to (M, N) bit data modifiers, wherein the data modifying signals comprise first to M-th bit data modifying signals, and
a (K, L) bit data modifier configured to output a (K, L) deserialized signal or an inverted signal of the (K, L) deserialized signal as a (K, L) bit line signal in response to a K-th bit data modifying signal, wherein K is a natural number equal to or less than M, and L is a natural number equal to or less than N.

8. The memory device of claim 7, wherein the (K, L) bit data modifier comprises:
a PMOS transistor, a NMOS transistor and an inverter,
wherein the (K, L) deserialized signal is applied to a first internal node of the (K, L) bit data modifier,
a source electrode of the PMOS transistor is connected to the first internal node, the K-th bit data modifying signal is applied to a gate electrode of the PMOS transistor, and a drain electrode of the PMOS transistor is connected to a second internal node of the (K, L) bit data modifier,
an input terminal of the inverter is connected to the first internal node, an output terminal of the inverter is connected to a source electrode of the NMOS transistor, the K-th bit data modifying signal is applied to a gate electrode of the NMOS transistor, and a drain electrode of the NMOS transistor is connected to the second internal node, and
the (K, L) bit line signal is outputted from the second internal node.

9. The memory device of claim 1, wherein the data modifier comprises:
(1, 1) to (2M, N) bit data modifiers, wherein the data modifying signals comprise first to M-th bit data modifying signals,
a (K, L) bit data modifier is configured to output a (K, L) deserialized signal or an inverted signal of the (K, L) deserialized signal as a (K, L) internal signal in response to the inversion control signal,
the (K, L) bit data modifier is configured to output the (K, L) internal signal or an inverted signal of the (K, L) internal signal as a (K, L) bit line signal in response to a K-th bit data modifying signal,
K is a natural number equal to or less than M, and
L is a natural number equal to or less than N.

10. The memory device of claim 1, wherein the error detector is configured to determine if an error exists in the (1, K) to (M, K) read signals and by increasing the value of K from 1 to N, wherein K is a natural number equal to or less than N.

11. The memory device of claim 10, wherein when the (1, K) to (M, K) read signals have an error, the error detector outputs one as the error determination, and when the (1, K) to (M, K) read signals do not have an error, the error detector outputs zero as the error determination.

12. A memory device test system, comprising:
a memory device; and
a tester configured to generate an address signal, a command signal, an inversion control signal and a clock signal, and to detect an error of the memory device, wherein the memory device comprises:
a controller configured to generate a test mode signal and data modifying signals in response to the address signal and the command signal;
a multiplexer (MUX) configured to output the clock signal as first to M-th internal data signals when the test mode signal is activated;
a deserializer configured to deserialize N bit values included in the first to M-th internal data signals to generate (1, 1) to (M, N) deserialized signals, wherein M and N are natural numbers;
a data modifier configured to invert the (1, 1) to (M, N) deserialized signals to generate (1, 1) to (M, N) bit line signals in response to the inversion control signal and the data modifying signals;
a memory cell array configured to store the (1, 1) to (M, N) bit line signals to memory cells corresponding to the address signal; and
an error detector configured to determine if an error exists in (1, 1) to (M, N) signals read from the memory cells and to output an error detecting signal indicative of the error determination.

13. The memory device test system of claim 12, wherein the error detector is configured to determine an error detecting result of (1, K) to (M, K) read signals and output the error detecting result of the (1, K) to (M, K) read signals as the error detecting signal, by increasing the value of K from 1 to N, wherein K is a natural number equal to or less than N.

14. The memory device test system of claim 13, wherein when the memory device does not have an error, the tester adjusts the address signal, the command signal and the inversion control signal so that the error detecting result of the (1, K) to (M, K) read signals is zero.

15. The memory device test system of claim 13, wherein when the (1, K) to (M, K) read signals have an error, the error detector outputs one as the error determination, and when the (1, K) to (M, K) read signals do not have an error, the error detector outputs zero as the error determination.

16. A memory device, comprising:
a multiplexer (MUX) configured to output a clock signal as a plurality of internal signals in response to a test mode signal;
a deserializer configured to generate a plurality of deserialized signals in response to the plurality of internal signals; and
a data modifier configured to invert the plurality of deserialized signals to generate a plurality of bit line signals in response to an inversion control signal and data modifying signals.

17. The memory device of claim 16, further comprising a controller configured to generate the test mode signal and the data modifying signals in response to an address signal and a command signal.

18. The memory device of claim 17, further comprising a memory cell array configured to store the plurality of bit line signals corresponding to the address signal.

19. The memory device of claim 18, further comprising an error detector configured to determine if an error exists in a plurality of signals read from memory cells of the memory cell array and to output an error detecting signal indicative of the error determination.

20. The memory device of claim 16, wherein the data modifier comprises:
- a plurality of first bit data modifiers and second bit data modifiers, wherein the first bit data modifiers are configured to output the plurality of deserialized signals or a plurality of inverted signals of the deserialized signals as a plurality of internal signals in response to the inversion control signal, and
- the second bit data modifiers are configured to output the plurality of internal signals or a plurality of inverted signals of the internal signals as the plurality of bit line signals in response to the data modifying signals.

* * * * *